United States Patent [19]

Miki

[11] Patent Number: 4,910,780

[45] Date of Patent: Mar. 20, 1990

[54] AUDIO SIGNAL RECORDING AND REPRODUCING APPARATUS UTILIZING DIGITAL DATA COMPRESSION AND EXTENSION

[75] Inventor: Tsutomu Miki, Hyogo, Japan

[73] Assignee: Mitsubishi Denki Kabushiki Kaisha, Japan

[21] Appl. No.: 216,539

[22] Filed: Jul. 8, 1988

[30] Foreign Application Priority Data

Jul. 14, 1987 [JP] Japan ................................. 62-175712

[51] Int. Cl.$^4$ ............................................. G10L 7/02
[52] U.S. Cl. ............................................. 381/32
[58] Field of Search ................................. 375/25–33; 381/29–33, 36–40, 34–35; 364/513.5

[56] References Cited

U.S. PATENT DOCUMENTS

| | | | |
|---|---|---|---|
| 4,021,799 | 5/1977 | Hinoshita et al. | 375/30 |
| 4,130,729 | 12/1978 | Gagnon | 381/30 |
| 4,354,273 | 10/1982 | Araseki et al. | 375/27 |
| 4,481,659 | 11/1984 | Adoul | 381/31 |
| 4,540,973 | 9/1985 | Grallert | 375/25 |
| 4,592,070 | 5/1986 | Chow et al. | 381/31 |
| 4,805,217 | 2/1989 | Morihiro et al. | 381/34 |

FOREIGN PATENT DOCUMENTS

| | | |
|---|---|---|
| 0117525 | 9/1984 | European Pat. Off. |
| 0245531 | 5/1986 | European Pat. Off. |
| 0204578 | 6/1986 | European Pat. Off. |
| 2124060 | 11/1973 | Fed. Rep. of Germany |
| 3534064 | 4/1986 | Fed. Rep. of Germany |

OTHER PUBLICATIONS

Parsons, "Voice and Speech Processing", McGraw-Hill 1986, p. 230.

*Primary Examiner*—Gary V. Harkcom
*Assistant Examiner*—John A. Merecki
*Attorney, Agent, or Firm*—Leydig, Voit & Mayer

[57] ABSTRACT

An audio signal recording and reproducing apparatus digitizes sound into an electric audio signal, data compresses the signal into compressed data to reduce information quantity, records the compressed data into a semiconductor memory, and reproduces an audio signal from the recorded data. The apparatus includes a plurality of input compression and output extension conversion tables which are used for compression conversion of input signal and extension conversion of output signal, respectively. Input compression and output extension conversion table selection counters are count-controlled by difference data representing the change of the audio signal. The apparatus selects one among a plurality of input compression and output extension conversion tables in accordance with count values of the selection counters. The conversion tables are arranged in sequence and contain successively larger ranges of values.

3 Claims, 4 Drawing Sheets

FIG. 3a
RECORDING SECTION
FIG. 3b
REPRODUCING SECTION
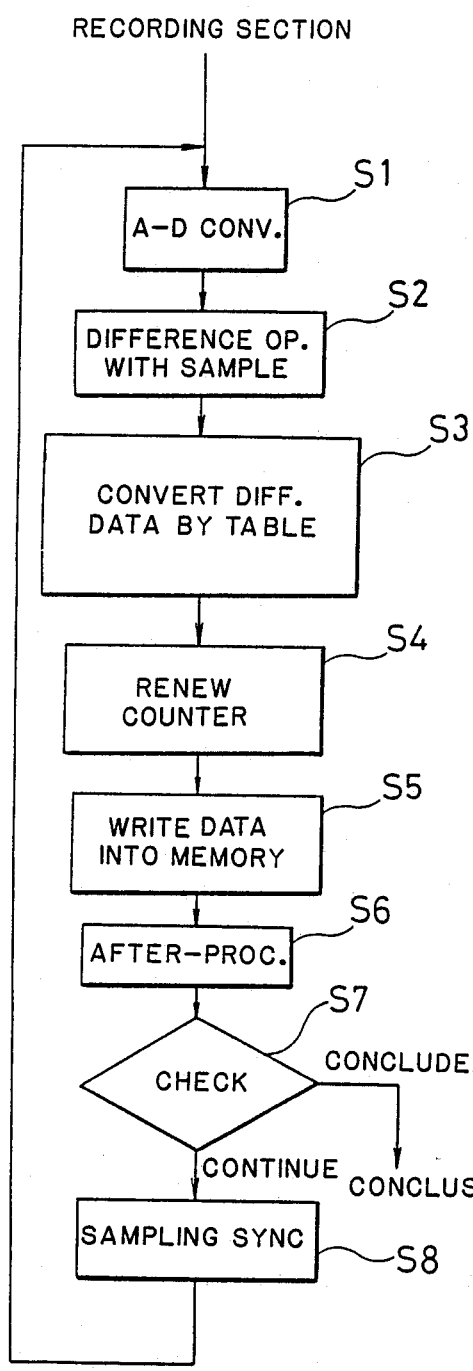
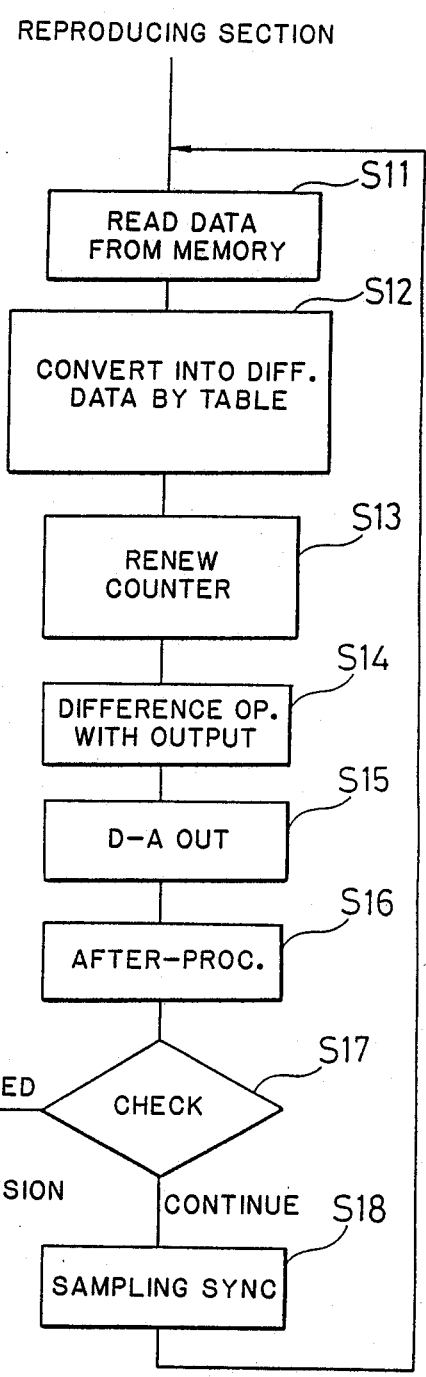

AUDIO SIGNAL RECORDING AND REPRODUCING APPARATUS UTILIZING DIGITAL DATA COMPRESSION AND EXTENSION

FIELD OF THE INVENTION

The present invention relates to an audio signal recording and reproducing apparatus and more particularly to that which records digitized audio signals in a semiconductor memory and reproduces the original sound from the recorded audio signal.

BACKGROUND OF THE INVENTION

FIG. 4 shows a construction of audio signal recording and reproducing apparatus adopting a differential PCM system according to the prior art.

In FIG. 4, an input microphone 1 converts sound into an electric signal, that is, an audio signal. As input signal amplifier 2 amplifies an audio signal from the input microphone 1. An input filter 3 removes extra audio signal band frequency components among the signal from the input signal amplifier 2 and executing preemphasis thereto. An analogue to digital converter 4 digitizes the signal from the input filter 3. A new input data register 5 holds the digital data obtained by the analogue to digital converter 4. An old input data register 6 holds the A-D converted digital data of one sample prior. An input data difference operator 7 operates a difference between the data held at the both data registers 5 and 6. A memory interface 8 conducts processes such as addressing, writing in, reading out, and refresh operation against a semiconductor memory. The operation result obtained by the input data difference operator 7 is written into a semiconductor memory 9 through the memory interface 8.

An old output data register 11 holds the output data of one sample prior at the reproduction and an output data difference operator 10 reads out the difference data recorded in the semiconductor memory 9 through the memory interface 8 and conducts addition operations against the content of the old output data register 11. A new output data register 12 holds the operation result of the output data difference operator 10 and a D-A converter 13 converts the digital data at the new output data register 12 to an analogue value. An output filter 14 removes quantization noise and executing emphasis thereto. An output signal power amplifier 15 amplifies the signal from the output filter 14. A speaker 16 converts the electric audio signal from the power amplifier 15 to sound.

The device operates as follows.

At first, sound is converted into an electric signal by the input microphone 1, and thereafter the audio signal is amplified by the input signal amplifier 2 and removal of extra audio signal band frequency components and preemphasis are executed thereto by the input filter 3. Thereafter, it is digitized by the A-D converter 4. The digitized audio signal is held by the new input data register 5 and a difference between that and the data of the old input data register 6 is operated by the input data difference operator 7, and the result is written in into the semiconductor memory 9 through the memory interface 8. The data of the new input data register 5 is transferred and stored to the old input data register 6 after the conclusion of operation by the input data difference operator 7.

The difference data stored in the semiconductor memory 9 is read out by the memory interface 8 and a difference operation is executed to the old output data register 11 by the output data difference operator 10. The operation result is stored in the new output data register 12 as well as stored at the old output data register 11.

The output digital data stored at the new output data register 12 is converted into an analogue signal by the D-A converter 13 and removal of quantization noise and emphasis are executed thereto by the output filter 14. Thereafter, the result is power amplified by the output signal power amplifier 15 and is output as sound from the output speaker 16.

In the prior art differential PCM system audio signal recording and reproducing apparatus of such a construction, it is not possible to obey the change of the audio signal exceeding a predetermined range of difference value and this results in deteriorated sound quality of reproduced sound due to the compression of audio information.

SUMMARY OF THE INVENTION

An object of the present invention is to provide an audio signal recording and reproducing apparatus capable of reproducing a higher quality sound than that of the prior art differential PCM system even from data of less information quantity.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, an audio signal recording and reproducing apparatus digitizes sound into an electric audio signal, data compresses the signal into compressed data to reduce information a quantity, records the compressed data into a semiconductor memory, and reproduces an audio signal from the recorded data. The apparatus includes a plurality of input compression conversion tables and output extension conversion tables. The conversion tables are arranged in sequence and contain successively larger ranges of values. The most appropriate conversion tables are selected by table selection counters in accordance with count values which are count-controlled by difference data representing the change in the audio signal, whereby the quality of reproduced sound is improved.

BRIEF DESCRIPTION OF THE DRAWINGS

FIGS. 3A and 3B are diagrams showing flowcharts for executing the recording and reproducing operations, respectively, of the embodiment of FIG. 1 by a program.

DETAILED DESCRIPTION OF THE PREFERRED EMBODIMENTS

An embodiment of the present invention will be described in detail with reference to the drawings.

Figure 1:
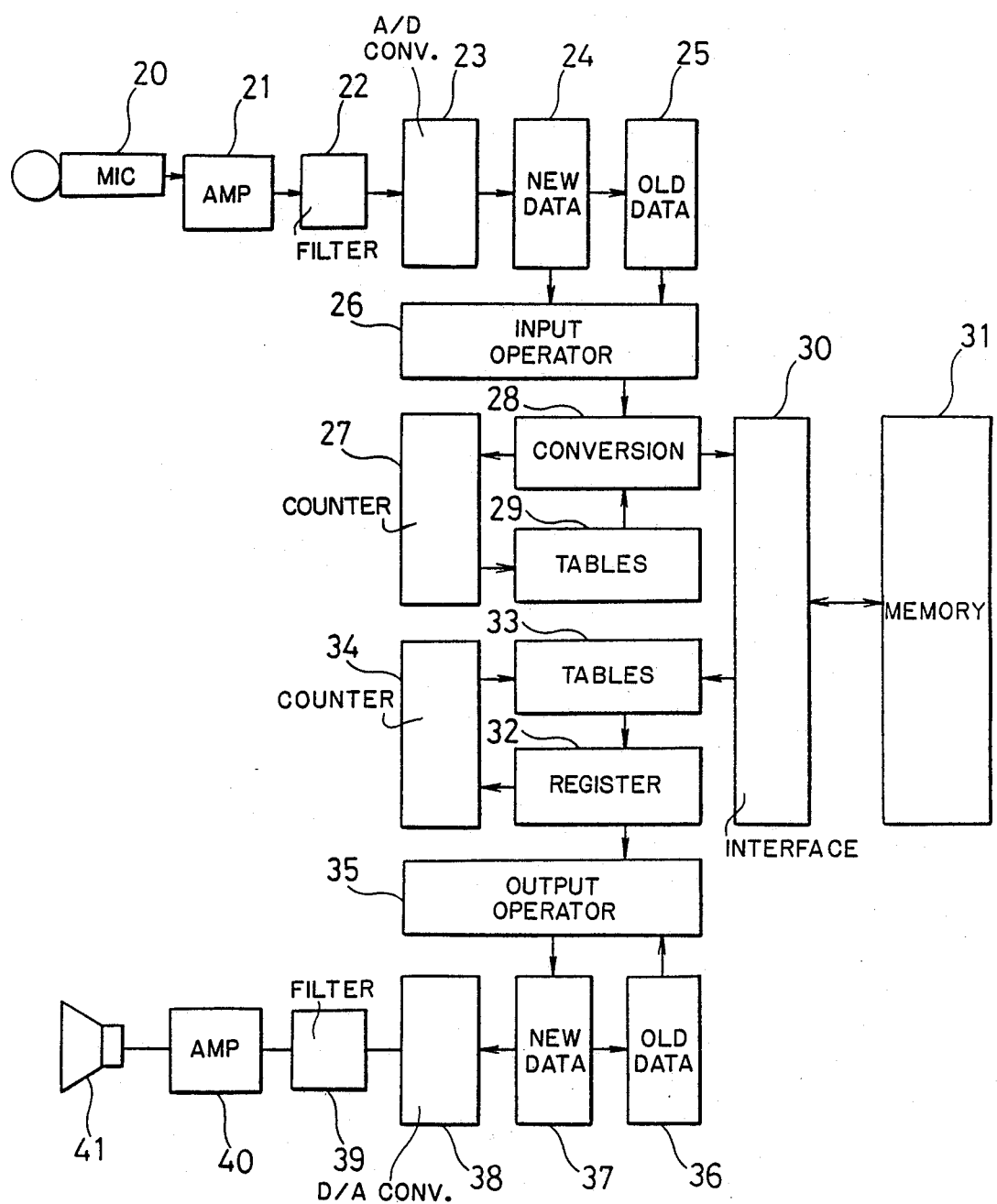
FIG. 1 is a diagram showing a construction of an audio signal recording and reproducing apparatus according to the present invention.

FIG. 1 shows an audio signal recording and reproducing apparatus according to the present invention. In FIG. 1, reference numeral 20 designates an input microphone, reference numeral 21 designates an input signal amplifier, reference numeral 22 designates an input filter, reference numeral 23 designates an A-D converter, reference numeral 24 designates a new input data register, and reference numeral 25 designates an old input data register, and these have the same or corresponding functions as those already described in the prior art device. An input data difference operator 26 operates a difference between the held data of the both registers 24 and 25. An input compression conversion table selection counter 27 selects one among a plurality of input compression conversion table 29. An input difference conversion section 28 compares the operation result by the input difference operator 26 and the content of a table selected from a plurality of input compression conversion tables 29 by the input compression conversion table selection counter 27. A memory interface 30 conducting writing in, reading out, and refresh operations against a semiconductor memory 31. An output extension conversion table selection counter 34 selects one among a plurality of output extension conversion tables 33. A register 32 holds the output difference value obtained by the output extension conversion table which is selected by the output extension conversion table selection counter 34 and the memory interface 30. An output data difference operation section 35 operates a difference between the contents of the register 32 and the old output data register 36. A new output data register 37 holds the operation result of the output data difference operator 35. Reference numeral 38 designates a D-A converter, reference numeral 39 designates an output filter, reference numeral 40 designates an output signal power amplifier, and reference numeral 41 designates an output speaker, and these have the same or corresponding functions as those already described in the prior art device.

The device operates as follows.

First of all, sound is converted into an electric signal by the input microphone 20, and thereafter the audio signal is amplified by the input signal amplifier 21. Removal of extra audio signal band frequency components and preemphasis are executed thereto by the input filter 22 and the result is converted into a digital value by the A-D converter 23. The audio data converted into digital data is held by the new input data register 24 and the difference between that and the content of the old input data register 25 is operated by the input data difference operator 26. The operation result is compression converted by the input difference conversion section 28 with the use of an input compression conversion table among the input compression conversion tables 29 which is selected by the input compression conversion table selection counter 27, and it is written in into the semiconductor memory 31 through the memory interface 30. The input compression conversion table selection counter 27 is up-counted or down-counted in accordance with the present time conversion value after the data to be written in into the semiconductor memory 31 is determined by the input difference conversion section 28, and thus a count value representing a new input compression conversion table is determined.

The conversion value stored at the semiconductor memory 31 is read out by the memory interface 30, and it is converted into a corresponding reproduced difference value in a table among a plurality of output extension conversion tables 33 which is selected by the output extension conversion table selection counter 34, and thereafter a difference operation is executed to the content of the old output data register 36 by the output data difference operator 35 to produce a reproduced digitized signal, and the reproduced digitized signal is stored at the new output data register 37. The output extension conversion table selection counter 34 is up-counted or down-counted in accordance with the present time conversion value after the content of the output difference register 32 is determined and a count value representing a new extension conversion table is determined.

The reproduced digitized signal stored at the new output data register 37 is converted into a reproduced output analogue signal by the D-A converter 38, and thereafter removal of quantization noise and emphasis are executed thereto by the output filter 39, and the result is power amplified by the output signal power amplifier 40 and is output as sound from the output speaker 41.

Next, an example of a method for converting the difference data between the contents of the new input data register 24 and the old input data register 25 into data to be stored in the semiconductor memory 31 will be described with reference to FIG. 2.

First of all, in the initial state, the input compression conversion table counter 50 (corresponding to 27 of FIG. 1) is in a reset state, and in this state, table No. 1 is selected by the output of the decoder 51. In this state, the differences from +4 to −3 correspond to the values of table No. 1 one to one and they are converted to conversion values of "7" to "0", respectively.

The difference data larger than +4 and the difference data smaller than −3 are converted into "7" and "0", respectively, as they are to be +4 and −3, respectively.

In this state, when a value larger than or equal to 4 and a value smaller than or equal to −3 are input as difference data, they are converted into corresponding conversion values as well as the input conversion table selection counter 50 is up-counted, thereby selecting table No. 2 as a conversion table for the next sample value.

The difference data of the m-th sample value is compression converted by utilizing table No. n which is determined by the change of the difference data from the initial state, and when the conversion data, that is, the conversion value is larger than or equal to 6 or smaller than or equal to 0, the input compression conversion table selection counter 50 is up-counted and when the conversion data is smaller than or equal to 5 or larger than or equal to 1, the input compression conversion table selection counter 50 is down-counted, thereby determining the compression conversion table for the next sample value.

When the conversion value is smaller than or equal to 5 or larger than or equal to 1 in a state where the input compression conversion table selection counter 50 represents table No. 1, the input compression conversion table selection counter 50 does not change. Similarly as above, when the conversion value is larger than or equal to 6 or smaller than or equal to 0 in a state where the input compression conversion table selection counter 50 represents table No. 6, the input compression conversion table selection counter 50 does not change.

The way of reading out data recorded in the semiconductor memory 31 and reproducing the new output data are conducted in accordance with the order reverse to that of the recording processing described above.

While in the above illustrated embodiment the recording section (which digitizes an audio signal, data compresses the signal so as to reduce the information quantity, and writes the signal into the semiconductor memory) and the reproducing section (which reads out information from the semiconductor memory and outputs sound) are produced integrated with each other, the recording section and the reproducing section may be provided independently of each other.

Furthermore, the input data difference operator 26, the input compression conversion table selection counter 27, and the input compression conversion tables 29 may also function as an output data difference operator 35, an output extension conversion table selection counter 34, and output extension conversion tables 33, respectively.

Figure 2:
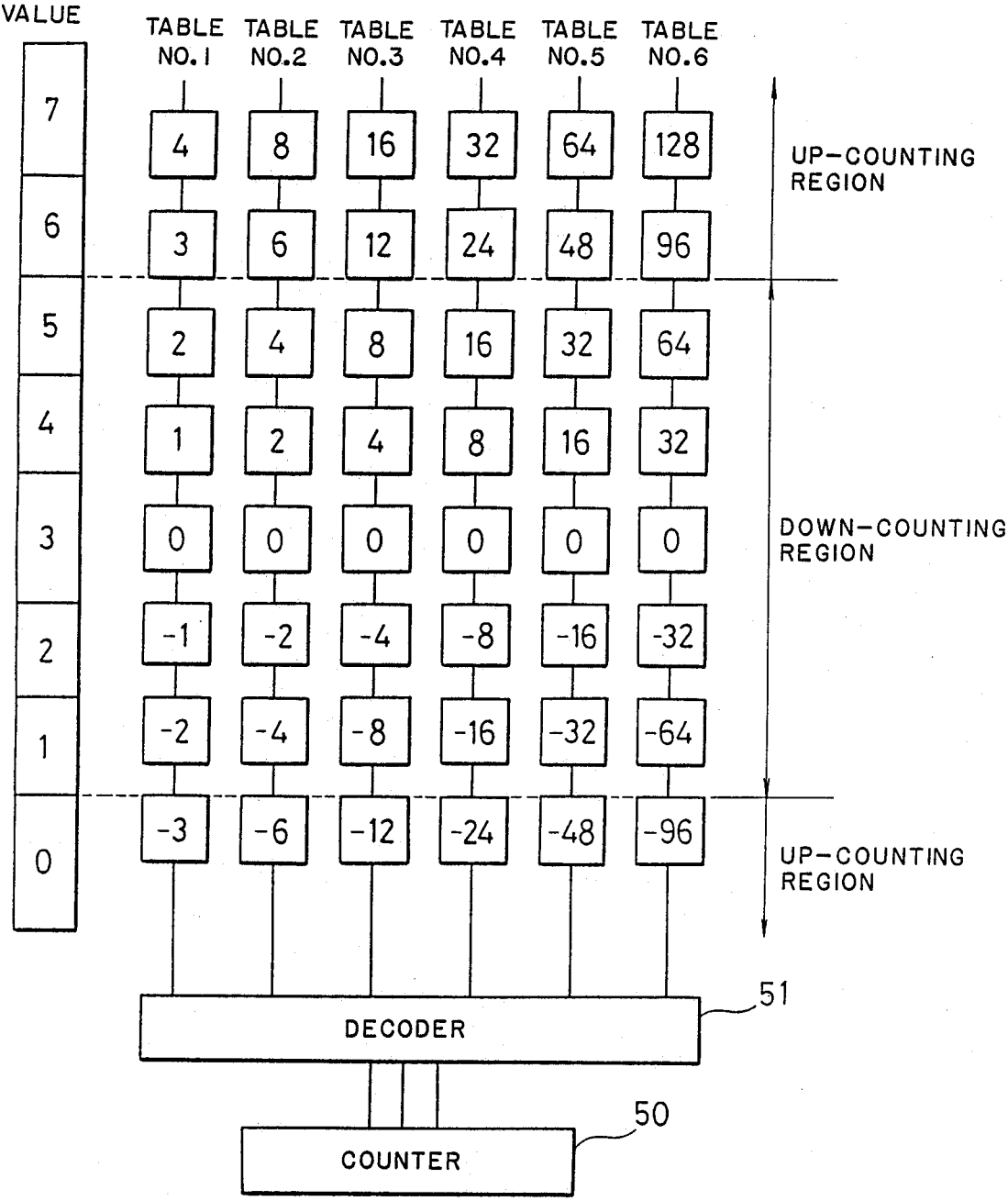
FIG. 2 is a diagram showing constructions of the input compression conversion table selection counter and the input compression conversion tables for explaining a concrete operation of the input difference conversion section of the apparatus of FIG. 1.
Figure 4:
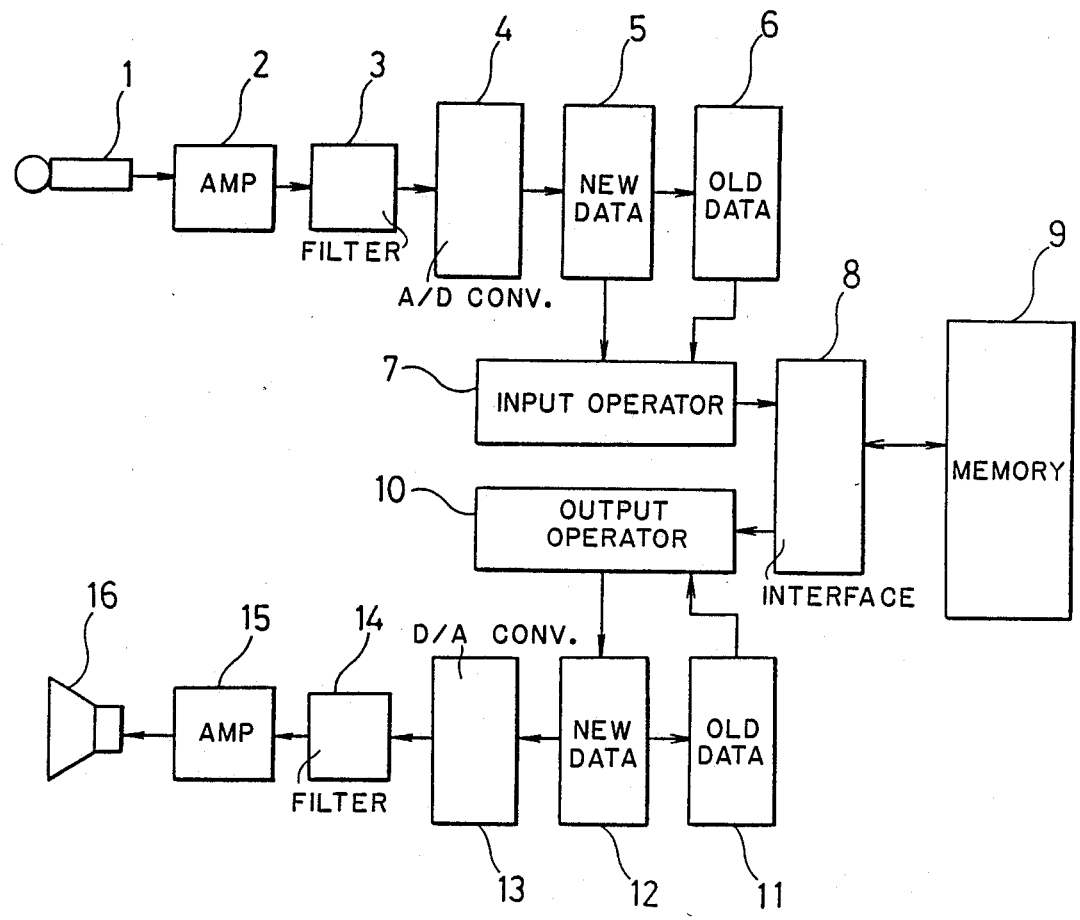
FIG. 4 is a diagram showing a construction of a prior art audio signal recording and reproduction apparatus.

While FIG. 2 shows an example of conversion used in the present invention in which the conversion value has 3 bits and the table has 6 ways of conversion, the conversion value may have 4 bits and the table may have more than 6 ways of conversion.

While in the above illustrated embodiment the condition wherein the input compression conversion table selection counter is up-counted is that the conversion value is larger than or equal to 6 or smaller than or equal to 0, this condition may be any other combination of conditions, such as the condition that the conversion value is larger than or equal to 4 or smaller than or equal to 2. Similarly as above, while the condition wherein the input compression conversion table selection counter is down-counted is that the conversion value is smaller than or equal to 5 and larger than or equal to 1 in the above illustrated embodiment, this condition may be any combination of conditions such as the condition that the conversion value is smaller than or equal to 6 and larger than or equal to 1.

The conversion values and the contents of the table may be any other values.

Furthermore, the operation of the above illustrated embodiment may be realized by a program corresponding to the flowcharts shown in FIGS. 3A and 3B. In FIG. 3A, reference characters S1 to S8 designate processing steps at the recording section. In FIG. 3B, reference characters S11 to S18 designate processing steps at the reproducing section. The after-processing steps S6 and S16 are processing steps for renewing the address of the semiconductor memory after writing in or reading out operation and the conclusion checking steps S7 and S17 are steps for dectecting that the address has reached the final address of the semiconductor memory or, in some cases, the final address of some block of the semiconductor memory, thereby to conclude the processing. The sampling synchronization steps S8 and S18 are steps for synchronization of sampling timing of the A/D or D/A conversion. Other than software processing for timing, a squeeze processing using a timer as a hardware processing can be employed.

As is evident from the foregoing description, according to the present invention, a plurality of input compression and output extension conversion tables are provided and the most appropriate compression and extension conversion tables are selected by the table selection counter in accordance with the change of the audio signal, whereby a high quality sound can be reproduced from a reduced quantity of data. Furthermore, data conversion is conducted by a table, and when the device is realized in hardware the table data is easily replaced, thereby resulting in a low cost system. Even when it is realized in software, the table data is easily replaced, thereby shortening the processing time.

What is claimed is:

1. An audio signal recording and reproducing apparatus comprising:

an analog to digital converter which digitizes sound into a digitized signal;

an input data difference operator connected to receive the digitized signal and to output difference data representing changes in the digitized signal;

means for data compressing the difference data into conversion values to reduce information quantity and for extending the conversion values into reproduced difference data;

a semiconductor memory connected to receive and store the conversion values from the means for compressing and to supply the conversion values to the means for extending;

an output data difference operator connected to receive the reproduced difference data and to output a reproduced digitized signal; and a digital to analog converter connected to receive the reproduced digitized signal and to output a reproduced output analog signal;

the means for compressing and extending including a plurality of input compression and output extension conversion tables which are used for compression conversion of the difference data into the conversion values and for extension conversion of the conversion values into the reproduced difference data, respectively, each input compression conversion table containing conversion values corresponding to a range of values of difference data, the input compression conversion tables being arranged in succession, the conversion values of each successive input compression conversion table corresponding to a successively larger range of difference data values, the output extension conversion tables being arranged in succession, each successive output extension conversion table containing a successively larger range of values of reproduced difference data corresponding to the conversion values, wherein compression conversion of the difference data into conversion signals includes reading conversion signals out of a selected one of the input compression conversion tables, and wherein extension conversion of the conversion values into reproduced difference data includes reading the reproduced difference data out of a selected one of the output extension conversion tables; and input compression and output extension conversion table selection counters which contain one of a plurality of count values, each of the plurality of count values corresponding to one of the input compression and output extension conversion tables, respectively, the input compression and output extension selection counters being count-controlled by the difference data and conversion values, respectively, to select the selected one among the plurality of input compression and output extension conversion tables, respectively, which corresponds with the count value contained by the counters.

2. An audio signal recording and reproducing apparatus as defined in claim 1 wherein said input compression and output extension conversion table selection counters contain one of a predetermined set of successive count values, the plurality of input compression and output extension conversion tables include one input compression conversion table corresponding to each of the successive count values of the input compression conversion table selection counter and one output extension conversion table corresponding to each of the successive count values of the output extension conversion table selection counter, the apparatus further comprising means for up-counting and for down-counting the count values in the selection counters between successive count values and for leaving the count values unchanged in accordance with whether the conversion value is within a predetermined range.

3. An audio signal recording and reproducing apparatus comprising:

an input data difference operator connected to receive a sequence of successive digital samples of an input audio signal and to output first difference values between successive samples;

a plurality of input compression conversion tables, each input compression conversion table containing a series of conversion values corresponding to a range of the first difference values, different input compression conversion tables containing conversion values corresponding respectively to different first difference values, the input compression conversion tables arranged in succession such that the conversion values of each successive input compression conversion table correspond to a successively larger range of difference values;

an input difference comparison section connected to receive each of the sequence of first difference values, to compare each first difference value with the contents of one of the plurality of input compression conversion tables and to compression convert each first difference value to produce compressed data including a conversion value from one of the input compression conversion tables;

a memory device connected to receive and store the compressed data;

a plurality of output extension conversion tables, each output extension conversion table containing a series of second difference values corresponding to a series of conversion values, different output extension conversion tables containing different ranges of difference values, the output extension conversion tables arranged in succession such that each successive output extension conversion table contains a successively larger range of difference values;

an output data difference operator connected to receive a sequence of said second difference values corresponding to conversion data stored in the memory device, the second difference values read from the output extension conversion tables, and to output a sequence of digitized output signals, each of the sequence of digitized output signals differing from a previous digitized output signal by a corresponding one of the second difference values;

an input compression conversion table selection counter containing one of the series of input compression conversion table selection values, each input compression converstion table selection value corresponding to one of the plurality of input compression conversion tables, wherein the input difference comparison section compression converts a first difference value to produce compressed data by reading a conversion value corresponding to the first difference value of an input compression conversion table corresponding to the input compression conversion table selection value contained in the input compression conversion table selection counter, and updates the input compression conversion table selection counter by up-counting or down-counting the input compression conversion table selection value based upon whether the first difference value exceeds a predetermined maximum value or is exceeded by a predetermined minimum value, respectively; and an output extension conversion table selection counter containing one of the series of output extension conversion table selection values, each output extension converstion table selection value corresponding to one of the plurality of output extension conversion tables, wherein the compressed data is converted into a sequence of second difference values by reading a second difference value corresponding to the compressed data out of an output extension conversion table corresponding to the output extension conversion table selection value contained in the output extension conversion table selection counter, and the output extension conversion table selection counter is updated by up-counting or down-counting the output extension conversion table selection value based upon whether the second difference value exceeds a predetermined maximum value or is exceeded by a predetermined minimum value, respectively.

* * * * *